(12) United States Patent
Ide

(10) Patent No.: US 7,515,008 B2
(45) Date of Patent: Apr. 7, 2009

(54) SEMICONDUCTOR INTEGRATED CIRCUIT HAVING OSCILLATOR FREQUENCY COMPENSATION FUNCTION

(75) Inventor: Shuichi Ide, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 137 days.

(21) Appl. No.: 11/798,986

(22) Filed: May 18, 2007

(65) Prior Publication Data

US 2007/0268167 A1 Nov. 22, 2007

(30) Foreign Application Priority Data

May 19, 2006 (JP) ............................. 2006-140252

(51) Int. Cl.
*H03L 1/02* (2006.01)

(52) U.S. Cl. ........................................ 331/176; 331/57

(58) Field of Classification Search .................. 331/176, 331/57

See application file for complete search history.

(56) References Cited

U.S. PATENT DOCUMENTS 6,281,761 B1 * 8/2001 Shin et al. .............. 331/116 FE
6,292,066 B1 * 9/2001 Shibuya et al. .............. 331/176
2001/0048349 A1 * 12/2001 Matsumoto et al. ........... 331/25

FOREIGN PATENT DOCUMENTS

JP 1-093904 4/1989

* cited by examiner

*Primary Examiner*—Joseph Chang
(74) *Attorney, Agent, or Firm*—Foley & Lardner LLP

(57) ABSTRACT

It is desired that the temperature dependency of the frequency of a oscillator in a semiconductor IC is compensated in high precision. First signal voltage having temperature dependency and second signal voltage set to be constant independently from the temperature are outputted and A/D converted into first and second converted signals. And the compensation code is generated in response to the ratio between the first and second converted signals. The temperature dependency of the frequency of the oscillator can be compensated by using the compensation code.

9 Claims, 12 Drawing Sheets

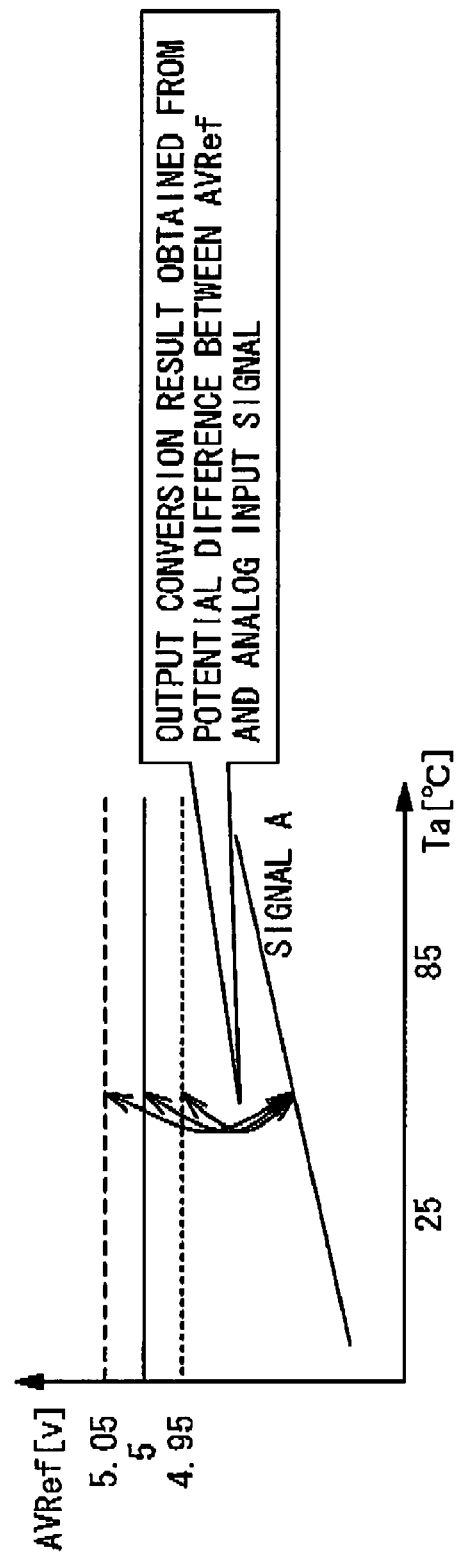

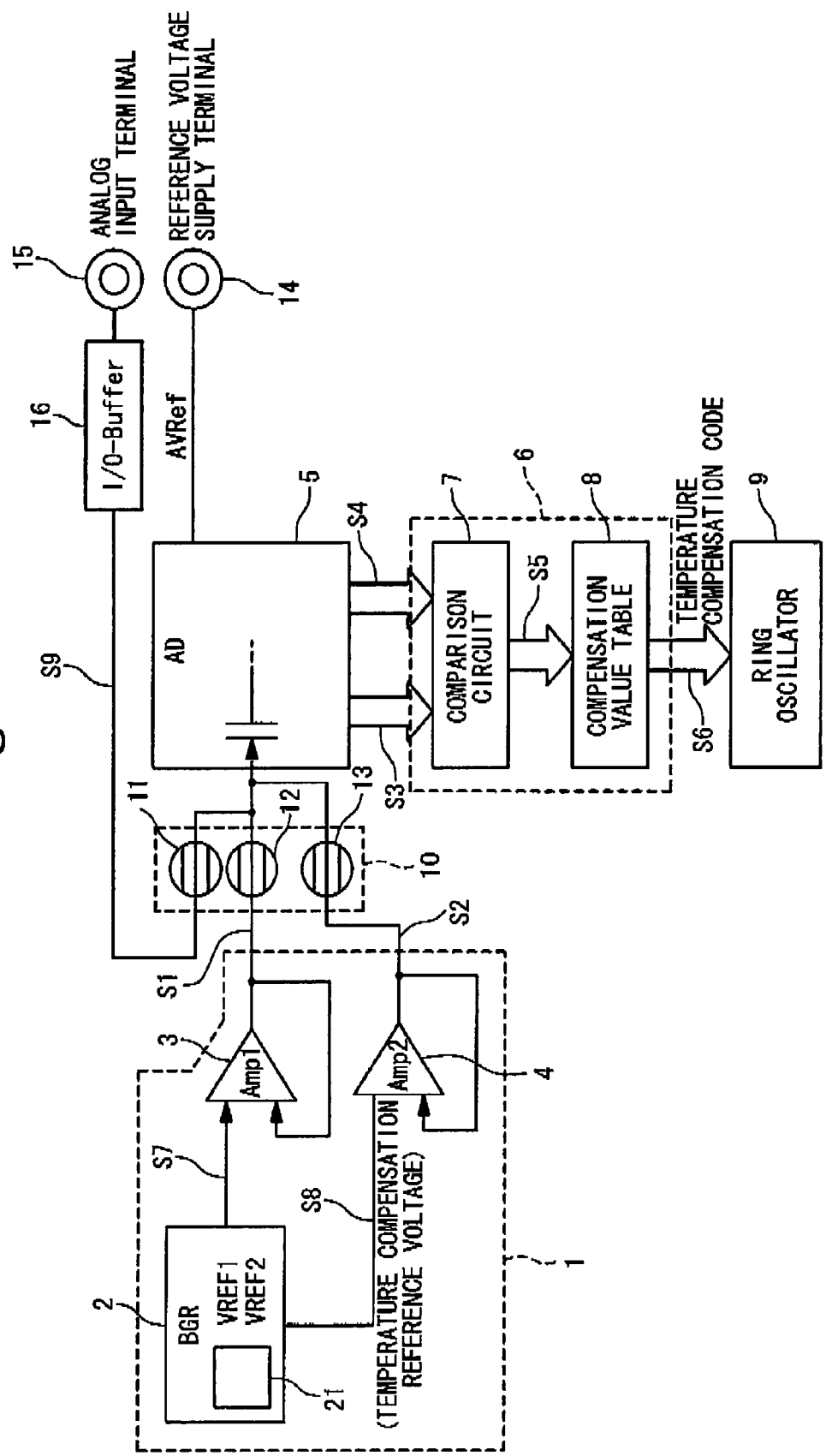

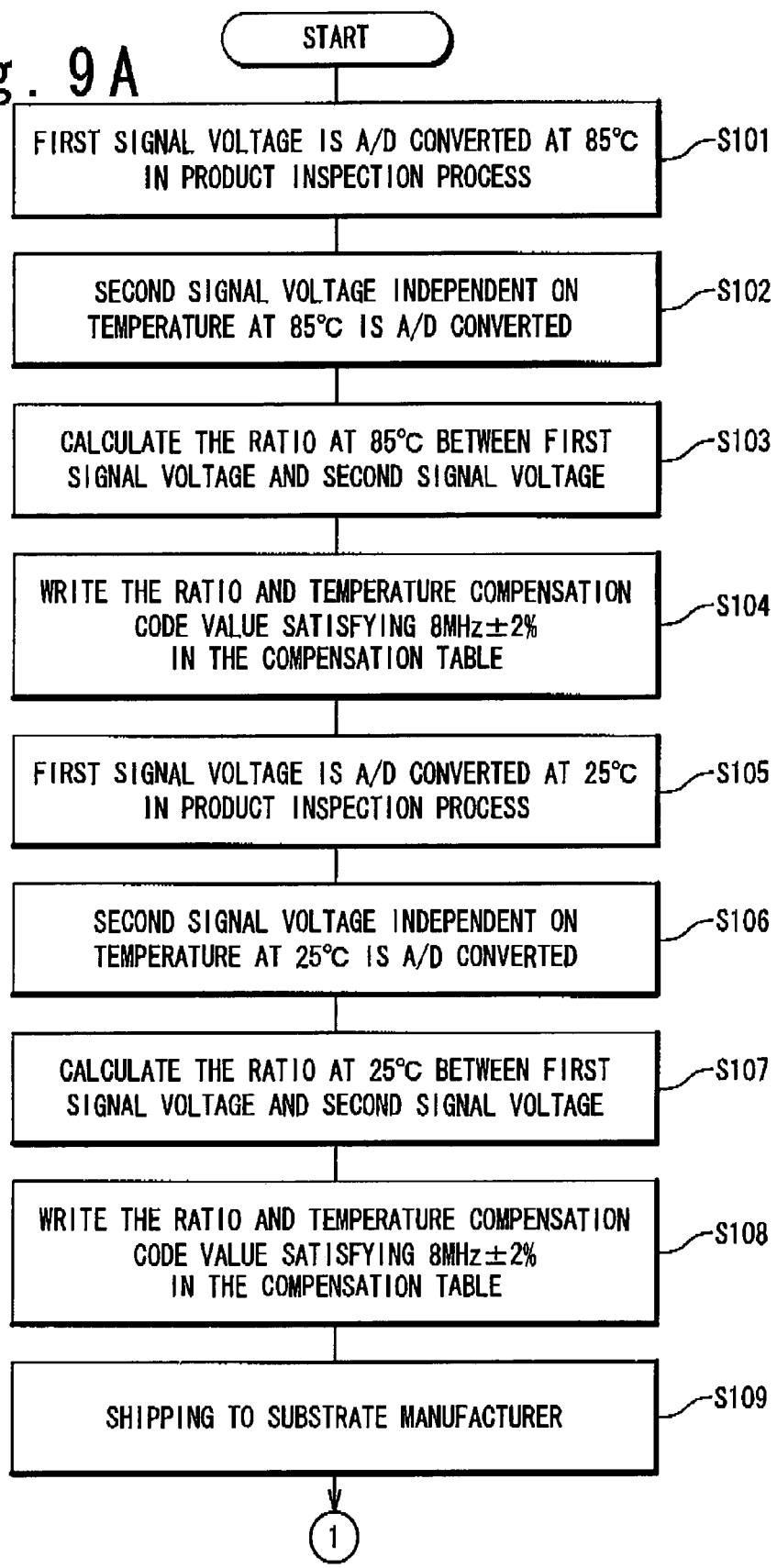

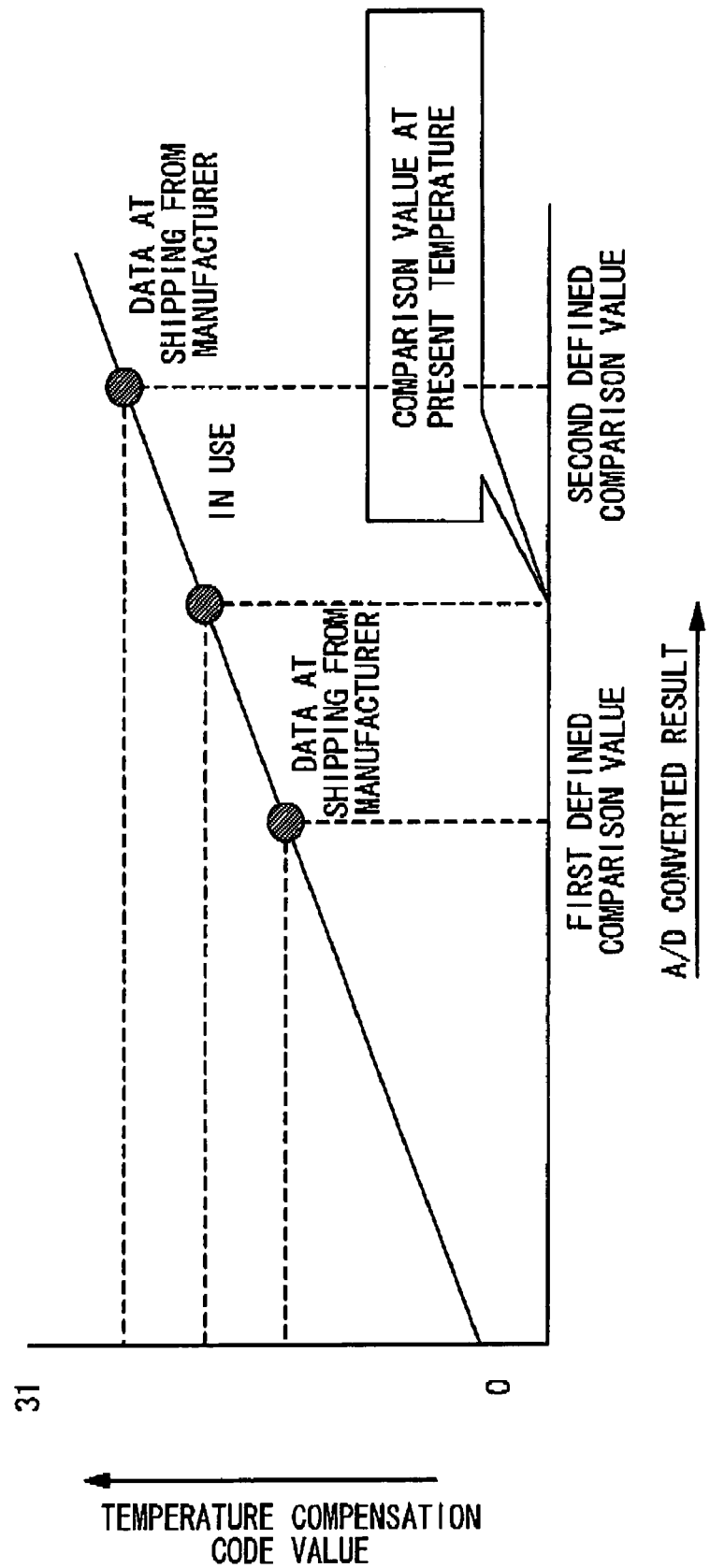

SEMICONDUCTOR INTEGRATED CIRCUIT HAVING OSCILLATOR FREQUENCY COMPENSATION FUNCTION

BACKGROUND OF THE INVENTION

1. Field of the Invention

The present invention relates to a semiconductor integrated circuit, and more particularly relates to a frequency compensation of an oscillator contained in a semiconductor integrated circuit.

2. Description of Related Art

In association with the progress of the information processing technology, the semiconductor integrated circuit having high precision has been required. The semiconductor integrated circuit has an oscillator for providing the clock signal. Correspondingly to the higher precision of the semiconductor integrated circuit in recent years, the oscillator built in a semiconductor integrated circuit is required to output the clock of the higher precision. For example, there is a case that the oscillator which outputs the clock of 8 MHz±2% in the assurance temperature range of the semiconductor integrated circuit is required. In order to design the oscillator for outputting the clock of the high precision, it is necessary to consider the temperature dependency. With regard to the oscillator, a technique for carrying out the compensation corresponding to the temperature (hereafter, referred to as a trimming) is known (for example, refer to Japanese Laid Open Patent Application JP-A-Heisei, 1-93904).

FIG. 1 is a block diagram showing the configuration of the temperature compensation type voltage control piezoelectric oscillator noted in the above mentioned Japanese Laid Open Patent Application JP-A-Heisei, 1-93904. With reference to FIG. 1, the environment temperature is detected by a temperature detector 101. The analog output of a temperature detector 101 is supplied to an analog-digital converter 102. The conversion output is sent to a memory circuit 103. The memory circuit 103 stores in advance a temperature compensation code corresponding to the conversion output of the analog-digital converter 102 that is a temperature address signal, in order to compensate the temperature dependency of the frequency of an oscillating element 118 used in a voltage control piezoelectric oscillator 105. Here, when the environment temperature is changed, the temperature address signal is also changed, and the temperature compensation code corresponding to the changed temperature is read from the memory circuit 103.

The read temperature compensation code is converted into an analog signal by a digital-analog converter 104, and sent through a terminal 110 and a resistor 107 to the cathode side of a variable capacitance diode 106 included in the voltage control piezoelectric oscillator 105. The control voltage to change the oscillator frequency is applied to the anode side of the variable capacitance diode 106 via a terminal 111 and a resistor 108. A resistor 109 has a high resistance of 100 kΩ or more, similarly to the resistors 107, 108 and holds the anode side of the variable capacitance diode 106 at the zero potential when the control voltage is not applied.

The analog-digital converter 102 is a device for converting the analog signal outputted from the temperature detector 101 to a digital signal. The analog-digital converter 102 defines a reference voltage supplied from a reference voltage supply terminal (not shown) as a reference voltage and converts an analog signal into a digital signal.

When the environment temperature is changed, the temperature compensation code changed correspondingly to the change is read from the memory circuit 103. Thus, the output voltage of the digital-analog converter 104 is changed correspondingly to the temperature change. As for the output from the digital-analog converter 104, the voltage to compensate the temperature dependency of the frequency of the voltage control piezoelectric oscillator 105 is applied to the cathode side of the variable capacitance diode 106. The capacitance of the variable capacitance diode 106 is controlled so as to be changed correspondingly to the output of the digital-analog converter 104 so that the oscillation frequency of the voltage control piezoelectric oscillator 105 is consequently constant.

FIGS. 2A, 2D are graphs showing the temperature dependency of the frequency and the variable frequency characteristic without temperature compensation of the frequency. FIG. 2A shows the temperature dependency of the frequency without temperature compensation, and FIG. 2B shows the variable frequency characteristic without the temperature compensation, respectively.

FIGS. 3A, 3B are graphs showing the temperature dependency of the frequency and variable frequency characteristic with the frequency temperature compensation. FIG. 3A shows the temperature dependency of the frequency with the frequency temperature compensation, and FIG. 3B shows the variable frequency characteristic with the frequency temperature compensation, respectively. Comparing FIGS. 2A, 2B and FIGS. 3A, 3B, the deviation of the frequency in the change of temperature is suppressed in the temperature compensation type voltage control piezoelectric oscillator according to the referenced document by carrying out the frequency temperature compensation. For example, with reference to FIG. 3B, even if the environment temperature is changed from 25° centigrade to Tl° centigrade, the change in the central frequency of the variable frequency characteristic is small.

Thus, according to the technique noted in the Japanese Laid Open Patent Application JP-A-Heisei, 1-93904, digital values to be used in the temperature compensation corresponding to the input digital values to the memory circuit 103 under the various temperatures are stored in advance in the memory circuit 103. Hence, the oscillation frequency is stabilized by a simple method without any complicated computer calculation.

SUMMARY

It has now been discovered that the above mentioned oscillation compensation technique has a problem as explained below.

The above mentioned type of semiconductor integrated circuit is manufactured by semiconductor manufactures and provided to substrate manufacturers and the like. Typically, the input voltage level of the reference voltage supply terminal on the analog-digital converter 102 is designed under a determined width specification such as between 2.7 volt and 5.5 volt. When an A/D conversion is carried out in the analog-digital converter 102, it is important that the reference voltage is not varied. The slight variation in the value of the reference voltage has no problem, in many cases. For example, when a semiconductor manufacturer provides semiconductor integrated circuits to a substrate manufacturer under the rule of a reference voltage AVRef=5.0V+5%, the reference voltage AVRef in the range between 4.75 volt and 5.25 volt is set on the set substrate of the substrate manufacturer. If only AVRef=5.0 v is allowed as a specification for avoiding such a deviation width, the specification will not be admitted in the market.

FIG. 4 is a graph showing the relation between the reference voltage AVRef serving as the reference voltage used in the A/D conversion and the temperature dependent signal inputted to the analog-digital converter 102. With reference to FIG. 4, it is indicated that in the analog-digital converter 102, the voltage level of the reference voltage AVRef serving as the reference voltage is different, which leads to the different A/D conversion result to be used in the temperature compensation.

As mentioned above, the temperature compensation code is stored in the memory circuit 103 by the semiconductor manufacturer and provided to the substrate manufacturer. If differences exist in the level of the reference voltage AVRef for each substrate manufactures, when the trimming corresponding to the temperature dependency is executed, the correspondence relation between the digital signal outputted from the analog-digital converter 102 and the temperature compensation code stored in the memory circuit 103 is deviated, and there is a case that the suitable trimming cannot be executed.

Even if the substrate manufacturer designs the circuit substrate so that 5.0 v is supplied, there is a case that because of a loss, a voltage drop and the like, the actually reference voltage AVRef including the deviation is supplied to the analog-digital converter 102.

As shown in FIG. 4, the voltage level (temperature dependent signal) having a temperature dependency is converted by using the voltage AVRef as a reference voltage. Thus, when the reference voltage AVRef=4.95 v or 5.05 v, the digital signal outputted from the analog-digital converter 102 differs from the digital signal outputted from the analog-digital converter 102 when the reference voltage AVRef=5.0 v.

In this way, in order to trim the frequency of the oscillator built in the semiconductor integrated circuit on the basis of the temperature, a temperature detector and an A/D converter are provided. A signal voltage indicating the temperature detected by a temperature detector is A/D-converted, and the trimming is carried out in accordance with the output of the conversion. However, the reference voltage supplied to the A/D converter is set by the substrate manufacturer, correspondingly to the substrate that includes the semiconductor integrated circuit. Thus, deviations are occurred in the reference voltage set by each substrate manufacturer.

The temperature compensation code, which is stored in the memory circuit 103 by semiconductor manufacturers, is outputted based on the reference voltage. Thus, if the reference voltages supplied to the A/D converter are deviated, the deviation is also occurred in the output temperature compensation code. Hence, there is a case that the trimming cannot be executed at the high precision.

In one embodiment of the present invention, a semiconductor integrated circuit includes: a signal voltage output unit configured to output a first signal voltage having temperature dependency and a second signal voltage being constant independently on a temperature; an A/D converter configured to convert an input signal voltage into a digital signal based on a reference signal; and a compensation code generation unit configured to compensate a frequency of an oscillator in response to the digital signal outputted from the A/D converter. The A/D converter generates a first conversion signal by digitalizing a first difference voltage being a ratio between the first signal voltage and the reference voltage and a second conversion signal by digitalizing a second difference voltage being a ratio between the second signal voltage and the reference voltage. The compensation code generation unit generates the compensation code in response to the first conversion signal and the second conversion signal.

In another embodiment of the present invention, a frequency compensation code generation method includes; (a) generating a first signal voltage having a temperature dependency; (b) generating a second signal voltage set to be constant against a variation of temperature; (c) generating a first conversion signal by digitalizing a first difference signal being a ratio of the first signal voltage and a reference voltage; (d) generating a second conversion signal by digitalizing a second difference signal being a ratio of the second signal voltage and the reference voltage; and (e) generating a compensation code for compensating a clock frequency of a oscillator in response to a ratio of the first conversion signal and the second conversion signal.

In further another embodiment of the present invention, a semiconductor integrated circuit includes: an oscillator configured to supply a clock signal; a frequency compensation circuit having an A/D converter converting an input analog signal into an output digital signal, and configured to compensate a frequency of the clock signal in response to a reference voltage supplied to the A/D converter; an analog signal supply terminal configured to supply the analog signal; and a reference voltage supply terminal configured to supply the reference voltage. The frequency compensation circuit includes: a signal voltage output unit configured to output a first signal voltage having temperature dependency and a second signal voltage being constant independently on a temperature; an A/D converter configured to convert an input signal voltage into a digital signal based on a reference signal; and a compensation code generation unit configured to compensate a frequency of an oscillator in response to the digital signal outputted from the A/D converter. The A/D converter generates a first conversion signal by digitalizing a first difference voltage being a ratio between the first signal voltage and the reference voltage and a second conversion signal by digitalizing a second difference voltage being a ratio between the second signal voltage and the reference voltage. The compensation code generation unit generates the compensation code in response to the first conversion signal and the second conversion signal to supply the compensation code to the oscillator. The oscillator compensates a frequency of the clock signal corresponding to the compensation code.

According to the present invention, even if a reference voltage supplied to an A/D converter is deviated, the trimming can be executed at a high precision.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a graph showing a relation between the voltage AVRef serving as a reference voltage in a A/D conversion and a temperature dependent signal inputted to an analog-digital converter 102;

FIG. 5 is a block diagram exemplifying the configuration of the semiconductor integrated circuit in one embodiment;

FIG. 9A is a flowchart exemplifying the former part of the operation in one embodiment;

FIG. 10 is a graph visually indicating a frequency compensation operation; and

DETAILED DESCRIPTION OF PREFERRED EMBODIMENTS

Figure 1:
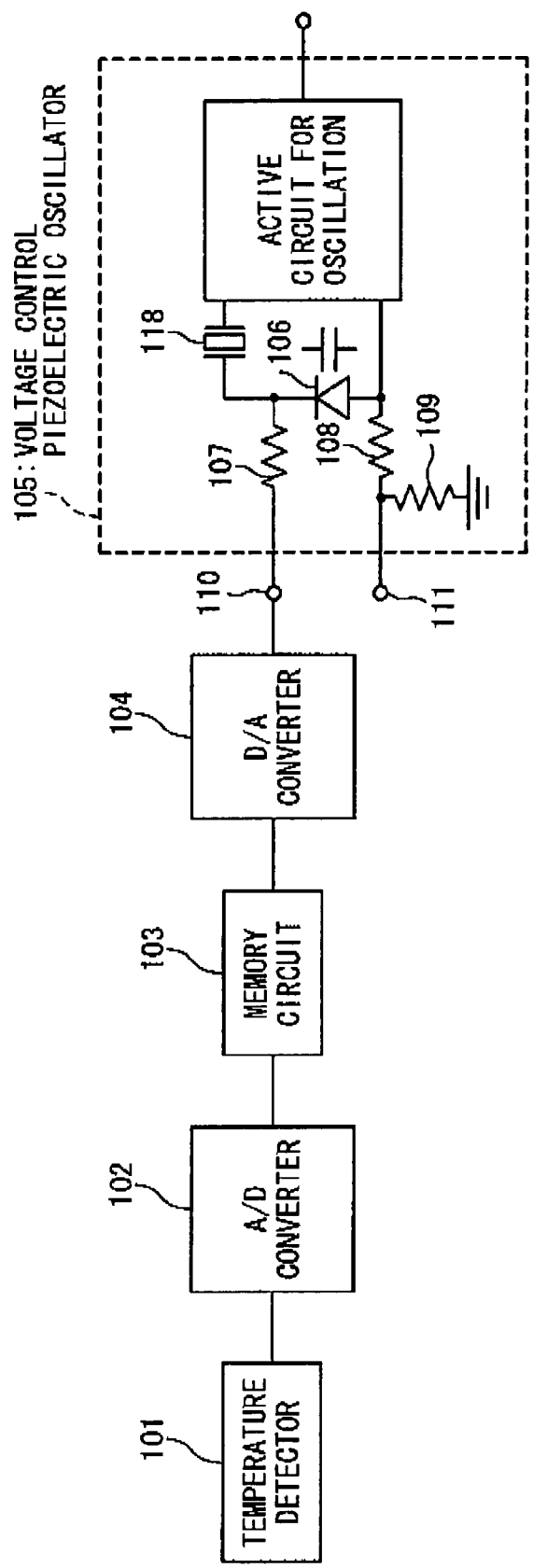
FIG. 1 is a block diagram showing a configuration of a temperature compensation type voltage control piezoelectric oscillator.
Figure 2A:
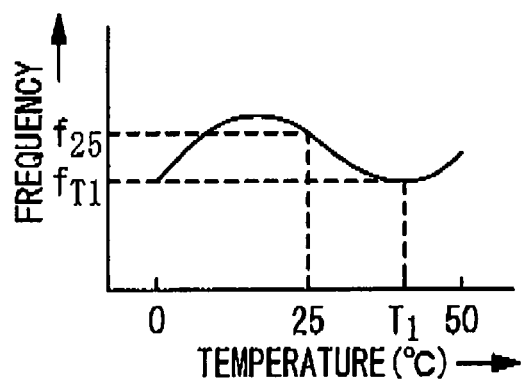
FIGS. 2A, 2B are graphs showing a temperature dependency of a frequency and a variable frequency characteristic without frequency temperature compensation in a temperature compensation type voltage control piezoelectric oscillator.
Figure 2B:
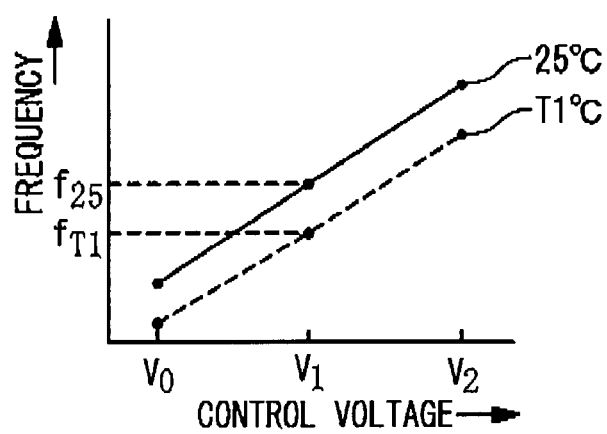
Figure 3A:
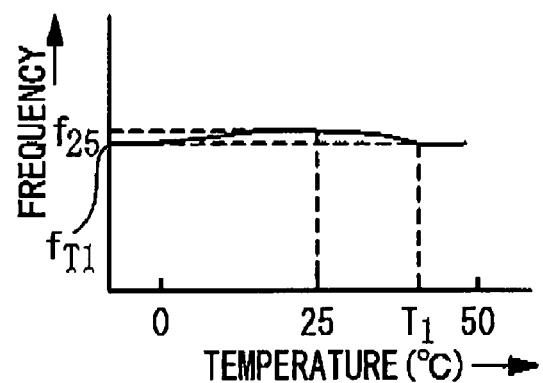
FIGS. 3A, 3B are graphs showing a temperature dependency of a frequency and a variable frequency characteristic with a frequency temperature compensation in a temperature compensation type voltage control piezoelectric oscillator.
Figure 3B:
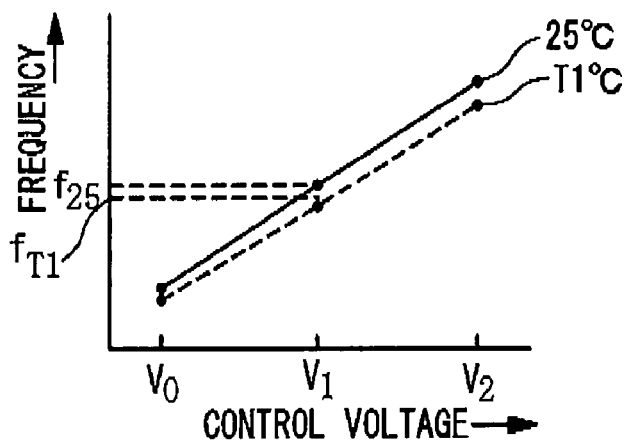

The invention will be now described herein with reference to illustrative embodiments. Those skilled in the art will recognize that many alternative embodiments can be accomplished using the teaching of the present invention and that the invention is not limited to the embodiments illustrated for explanatory purposes.

There are various kinds of oscillators that can be built in a semiconductor integrated circuit. Among them, the semiconductor integrated circuit including a ring oscillator using a digital circuit becomes popular in recent years. Thus, the following embodiments are explained under the assumption of a case where the oscillator, the frequency thereof is to be compensated, is a ring oscillator. The ring oscillator is a circuit that has an oscillating function realized by odd-numbered inverter circuits combined to each other.

Referring now to FIG. 5, the semiconductor integrated circuit according to a first embodiment of the present invention includes a signal voltage output unit 1, an A/D converter 5, a compensation code generator 6, a ring oscillator 9 and a switch group 10. The signal voltage output unit 1 outputs a signal voltage (hereafter, referred to as a first signal voltage S1) that which is temperature dependent and a signal voltage (hereafter, referred to as a second signal voltage S2) that is constant independently from the temperature, to the A/D converter 5.

The signal voltage output unit 1 is composed of a band gap reference circuit 2, a first amplifier 3 and a second amplifier 4. The band gap reference circuit 2 contains a temperature sensor 21. A temperature dependent signal indicating the temperature detected by the temperature sensor 21 is supplied to the first amplifier 3 through a first terminal VREF1. The band gap reference circuit 2 sends a temperature independence signal SB, which is a signal having no dependency on the detected temperature, through a second terminal VREF2 to the second amplifier 4.

The first amplifier 3 generates a first signal voltage S1 by amplifying the temperature dependent signal S7 sent from the band gap reference circuit 2. The first signal voltage S1 is sent to the A/D converter 5 through the switch group 10. The second amplifier 4 generates a second signal voltage S2 by amplifying the temperature independent signal S8 sent from the band gap reference circuit 2. The second signal voltage S2 is sent to the A/D converter 5 through the switch group 10.

The A/D converter 5 has an analog-digital conversion function for converting an input analog signal into an output digital signal. As shown in FIG. 5, an analog signal is sent through the switch group 10 to the A/D converter 5. Also, a reference voltage AVRef is sent to the A/D converter 5 from the reference voltage supply terminal 14. The A/D converter 5 executes the analog-digital conversion corresponding to the reference voltage AVRef. The A/D converter 5 execute the analog-digital conversion to generate the conversion result (hereafter, referred to as a first conversion signal S3 or second conversion signal S4) and sends it to the compensation code generator 6.

The compensation code generator 6 is the function block for outputting a temperature compensation code S6 in this embodiment. As shown in FIG. 5, the compensation code generator 6 is composed of a comparison circuit 7 and a compensation value table 8. The comparison circuit 7 calculates the ratio between the first conversion signal S3 which is the A/D converted first signal voltage S1 and the second conversion signal S4 which is the A/D converted second conversion signal S2. The comparison circuit 7 sends a comparison signal S5 indicating the ratio between the first conversion signal S3 and the second conversion signal S4, to the compensation value table 8. The compensation value table 8 outputs the stored temperature compensation code S6, in response to the comparison signal S5. Here, the compensation value table 8 holds a temperature compensation code S6 (hereafter, referred to as a first defined temperature code) corresponding to the comparison signal S5 (hereafter, referred to as a first defined comparison value) at a first defined temperature (for example, 25° centigrade) and a temperature compensation code S6 (hereafter, referred to as a second defined temperature code) corresponding to the comparison signal S5 (hereafter, referred to as a second defined comparison value) at a second defined temperature (for example, 85° centigrade) The compensation value table 8 further stores a temperature compensation code S6 corresponding to assumable comparison signals S5. Those temperature compensation codes S6 are the values that are stored for each commodity sample by each semiconductor manufacturer.

The A/D converter 5 in this embodiment, when compensating the frequency of the ring oscillator 9 (hereafter, referred to as a frequency compensation mode), outputs the first and second conversion signals S3, S4 in response to the first and second signal voltages S1, S2. On the other hand, when the A/D converter 5 is used as a usual A/D converter (hereafter, referred to as a usual mode), an analog input signal S9 is sent from an analog input terminal 15. The analog input signal S9 serves as the analog input to the A/D converter 5 through an I/O-Buffer 16. The switch group 10 contains a plurality of switches (11 to 13) to select the analog inputs to the A/D converter.

Figure 6:
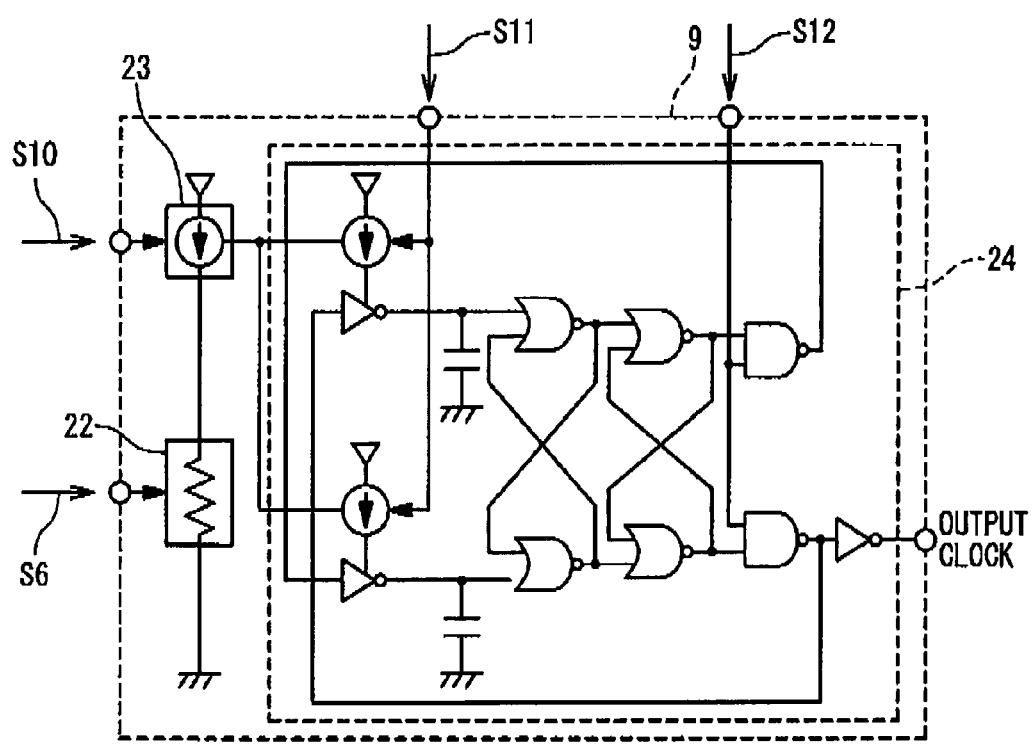
FIG. 6 is a block diagram exemplifying the configuration of the ring oscillator in one embodiment.

FIG. 6 is a circuit diagram exemplifying a configuration of the ring oscillator 9 targeted for the trimming. With reference to FIG. 6, the ring oscillator 9 in this embodiment includes: a trimming circuit 22 for compensating a frequency in response to a temperature compensation code S6; a current source 23 for providing a predetermined current in response to a basic trimming signal S10; and an oscillator 24 that is operated in response to the current provided from the current source 23. The oscillator 24 has the configuration where a frequency of a clock to be outputted is changed in response to a frequency switch signal S11, and the operation is stopped in response to a stop signal S12.

Figure 7:
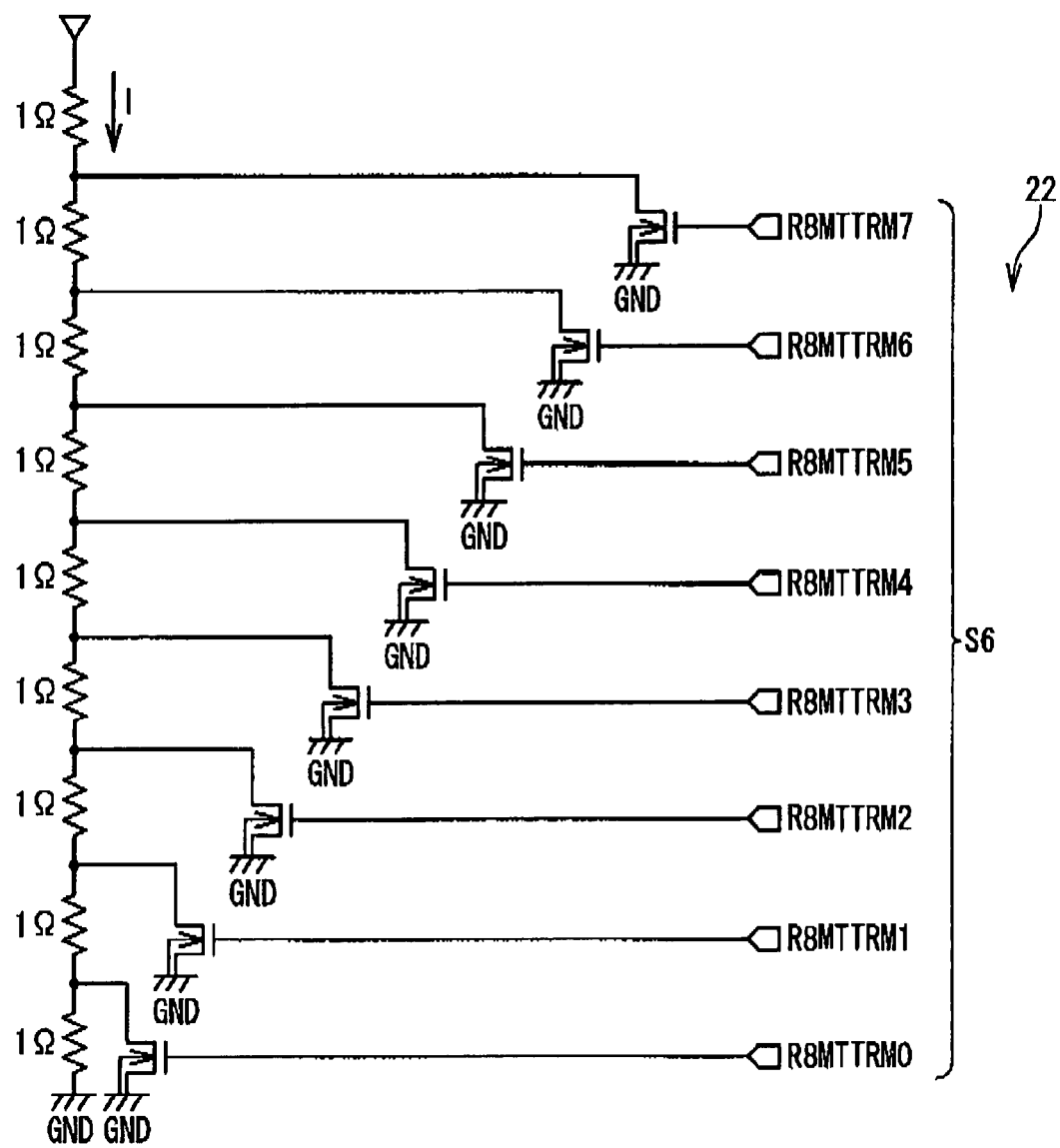
FIG. 7 is a circuit diagram exemplifying the configuration of the trimming circuit 22.

FIG. 7 is a circuit diagram exemplifying a configuration of the trimming circuit 22. With reference to FIG. 7, the trimming circuit 22 includes a plurality of resistors that are connected in series and a plurality of transistors that are operated in response to the temperature compensation code S6. As shown in FIG. 7, the plurality of transistors control the connections of the plurality of resistors, in response to the temperature compensation code S6.

[Operation]

The operations of this embodiment will be described below. In the following explanation, the level of the voltage AVRef serving as the reference voltage of the A/D converter 5 is assumed to be still under the set condition by the substrate manufacturer. In this case, in the semiconductor integrated circuit in this embodiment, the switch group 10 is switched for set the A/D converter 5 to the frequency compensation mode. In this mode, the signal voltage output unit 1 outputs the first and second signal voltages S1, S2 for compensating the temperature dependency. The switch group 10, while switching a second switch 12 and a third switch 13 to select the analog input signal of the A/D converter 5 for the first and second signal voltages S1, S2 in turn, performs the A/D conversion two times. Thus, the comparison circuit 7 receives the conversion result (the first conversion signal S3) for the first signal voltage S1 and the conversion result (the second conversion signal S4) for the second signal voltage S2. The comparison circuit 7 calculates the ratio between the first conversion signal S3 and the second conversion signal S4 and sends the comparison signal S5 indicating the ratio to the compensation value table 8.

Under the use conditions recommended by the substrate manufacturer, the first and second defined comparison values and the first and second defined temperature codes, which are stored in the compensation value table 8, are used to apply the ratio of the A/D conversion result at a present temperature. Consequently, the optimal "Temperature Compensation Code" of the present temperature is calculated and sent to the built-in ring oscillator 9.

Figure 8:
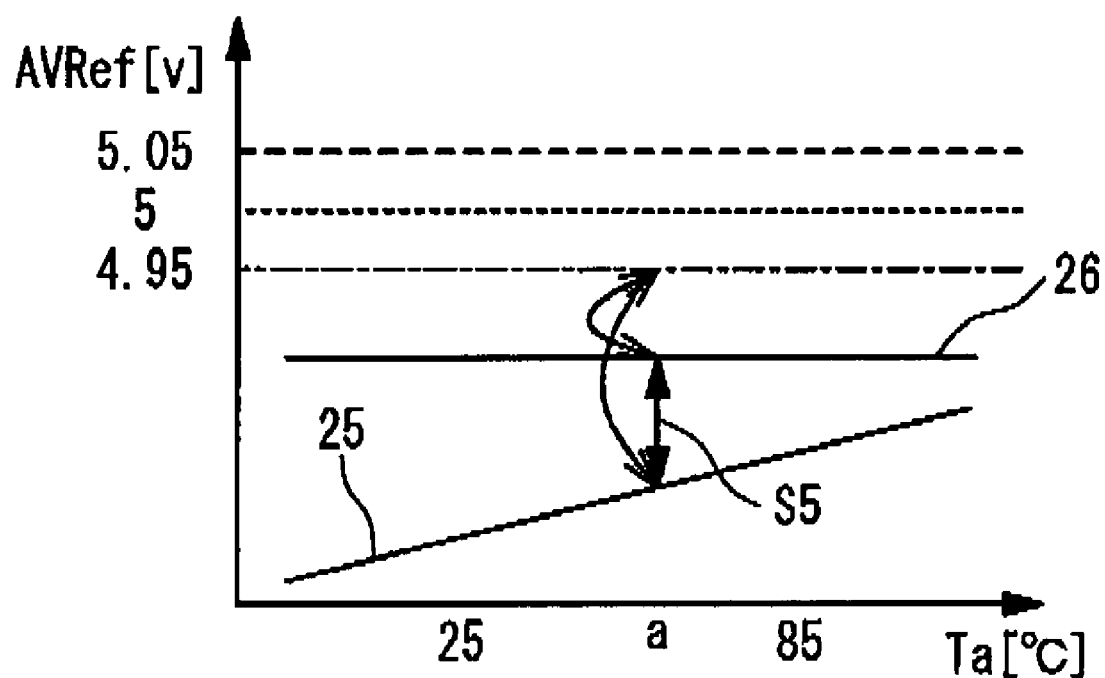
FIG. 8 is a view visually showing operations in one embodiment.

FIG. 8 is a graph visually showing the compensating operations. In FIG. 8, a line 25 shows the first signal voltage S1 outputted by the signal voltage output unit 1, plotted with respect to the temperature change. Similarly, a line 26 shows the second signal voltage S2 outputted by the signal voltage output unit 1 plotted with respect to the temperature change. FIG. 6 exemplifies a case where, although a voltage level of 5.0 volt is objected to be supplied as the reference voltage AVRef, 4.95 volt is actually supplied. With reference to FIG. 8, in this case, the A/D converter 5 converts the second signal voltage S2 which is independent to the temperature change and the first signal voltage S1 having a temperature dependency for the reference voltage (AVRef) 4.95 v. The comparison circuit 7 calculates the ratio of the conversion result between both of them. Thus, even if the reference voltage (AVRef) is varied for the difference of substrate manufacturers, the constant result can be always obtained at a certain particular temperature.

As mentioned above, in this embodiment, the compensation value table 8 stores the first defined comparison value indicating the ratio between the output values of the A/D conversion of the first and second signal voltages S1, 32 at the first defined temperature (25° centigrade) and the second defined comparison value indicating the ratio between the output values of the A/D conversion of the first and second signal voltages S1, S2 at the second defined temperature (85° centigrade). The compensation value table 8 further stores the first defined temperature code indicating the temperature compensation code corresponding to the first defined comparison value and the second defined temperature code indicating the temperature compensation code corresponding to the second defined comparison value. Those values are set by the semiconductor manufacturer. In the compensation value table 8, those values are used to determine the inclinations of the temperature dependency characteristics, and "Temperature Compensation Code" at a measurement temperature is obtained.

As mentioned above, the operations in this embodiment achieve an effect, due to the linkage between the operations in the semiconductor maker manufacturing semiconductor ICs and the operations in the substrate maker manufacturing substrates for mounting the semiconductor ICs. Such linkage series of the operations in this embodiment will be described below with reference to the drawings. In the following explanation, it is assumed that the first defined temperature is 25° centigrade and the second defined temperature is 85° centigrade.

FIG. 9A is a flowchart exemplifying the former part of the operations in this embodiment. With reference to FIG. 9A, at the step S101, a product is inspected in a semiconductor manufacturer side. At this inspection step, the A/D converter 5 A/D-converts the first signal voltage S1 which is generated by amplifying the temperature dependent signal S7 at 85° centigrade into the first conversion signal S3. After that, at the step S102, the A/D converter 5 A/D-converts the second signal voltage S2 which is generated by amplifying the temperature independence signal S8 at 85° centigrade into the second conversion signal S4.

At the step S103, the comparison circuit 7 receives the first and second conversion signals S3, S4 at 85° centigrade. The comparison circuit 7 provides the comparison signal S5 (second defined comparison value), which indicates the ratio between the first and second conversion signals S3, S4, to the compensation value table 8. At the step S104, the compensation value table 8 holds the comparison signal S5 at 85° centigrade and the temperature compensation code (second defined temperature code) corresponding to the comparison signal S5.

After that, the compensation value table 8 holds the comparison signal S5 (the first defined comparison value) at 25° centigrade and the temperature compensation code (the first defined temperature code) corresponding to the comparison signal S5 (steps S105 to S108). After that, at the step S109, the manufactured semiconductor integrated circuit is provided to substrate makers.

Figure 9B:
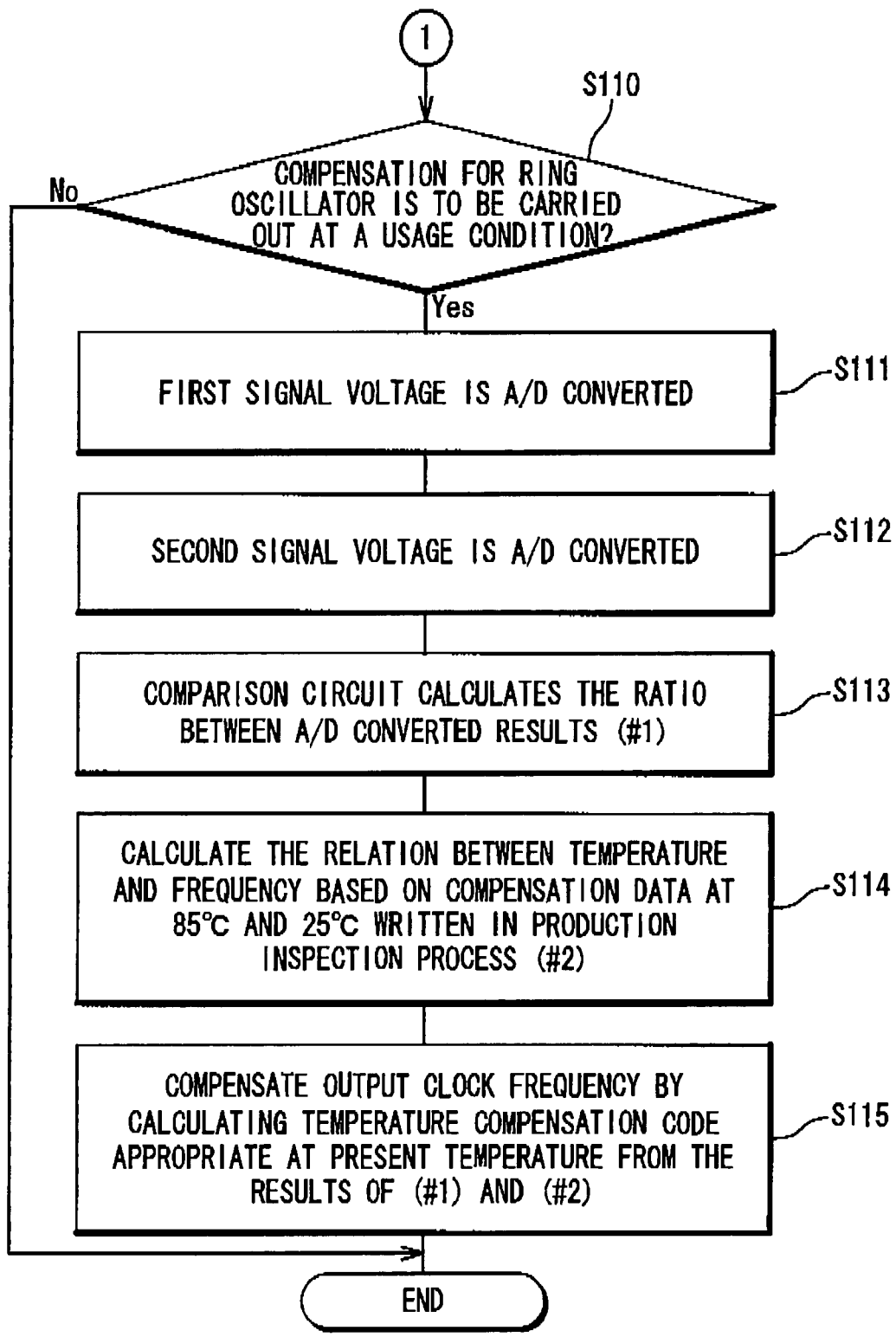
FIG. 9B is a flowchart exemplifying the latter part of the operation in one embodiment.

FIG. 9B is a flowchart exemplifying the latter part of the operations in this embodiment. With reference to FIG. 9B, at the step S110, a substrate manufacturer judges whether the frequency compensation of the ring oscillator is to be executed or not. As the judged result, if there is no necessity of executing the frequency compensation, this compensation process is ended. If there is necessity of executing the frequency compensation, the process from the step S111 is executed.

At the step S111, the band gap reference circuit 2 outputs the temperature dependent signal S7 of the present temperature to the first amplifier 3. The first amplifier 3 outputs the first signal voltage S1 which is generated by amplifying the temperature dependent signal S7 to the A/D converter 5. The A/D converter 5 A/D-converts the first signal voltage S1 to generate the first conversion signal S3.

At the step S112, the band gap reference circuit 2 outputs the temperature independence signal S8 of the present temperature to the second amplifier 4. The second amplifier 4 outputs the second signal voltage 52 which is generated by amplifying the temperature independence signal S8 to the A/D converter 5. The A/D converter 5 A/D-converts the second signal voltage S2 to generate the second signal voltage S4.

At the step S113, the comparison circuit 7 receives the first and second conversion signals S3, S4 of the present temperature. The comparison circuit 7 provides the comparison signal S5, which indicates the ratio between the first and second conversion signals S3, S4, to the compensation value table 8.

At the step S114, the compensation value table 8 calculates the temperature compensation code at the present temperature by using the first and second defined comparison values and first and second defined temperature codes, which are held in advance, and the comparison signal S5 of the present temperature. The compensation value table 8 sends the calculated temperature compensation code to the ring oscillator 9.

With the above explained configurations and operations, the frequency of the ring oscillator 9 is compensated and the temperature dependency of the frequency is compensated at high precision. Here, the operations at the steps S111 to S114 are explained more in detail. FIG. 10 is a graph visually showing the operations. The compensation value table 8 of the semiconductor integrated circuit in this embodiment stores the first and second defined comparison values and the first and second defined temperature codes for each sample of the products, in the inspecting process. As mentioned above, the first defined comparison value is the comparison signal S5 indicating the ratio between the first and second conversion signals S3, S4 at 25° centigrade. Also, the second defined comparison value is the comparison signal S5 indicating the ratio between the first and second conversion signals 53, S4 at 85° centigrade. Also, the first defined temperature code is the temperature compensation code corresponding to the first defined comparison value. And the second defined temperature code is the temperature compensation code corresponding to the second defined comparison value.

With reference to FIG. 10, the temperature compensation code is determined to be proportional to the temperature. Thus, the desirable temperature compensation code is obtained by calculating the slope (namely, the proportionality coefficient) from the first and second defined comparison values and the first and second defined temperature codes, and then applying the comparison signal S5 to the slope at the temperature on which the compensation is to be executed.

The equations used in the above explained calculating process will be described below. By substituting the values into the following equation (1), the temperature compensation code at the present temperature is calculated.

$$TTRMnow = \{(TTRMH-TTRML)/(TSADRH-TSADRL)\}*(TSADRnow-TSADRL)+TTRML \quad (1)$$

TSADRL: First Defined Comparison Value;
TSADRH: Second Defined Comparison Value;
TSADRnow: Present Comparison Signal s5;
TTRML: First Defined Temperature Code;
TTRMH: Second Defined Temperature Code; and
TTRMnow: Present Temperature Compensation Code.

By controlling the ON/OFF of the transistor in the trimming circuit 22 in the ring oscillator 9 using the temperature compensation code at the present temperature obtained from the equation (1), the amount of the current is regulated and the frequency of the output clock of the ring oscillator 9 is compensated.

COMPARISON EXAMPLE

Figure 11:
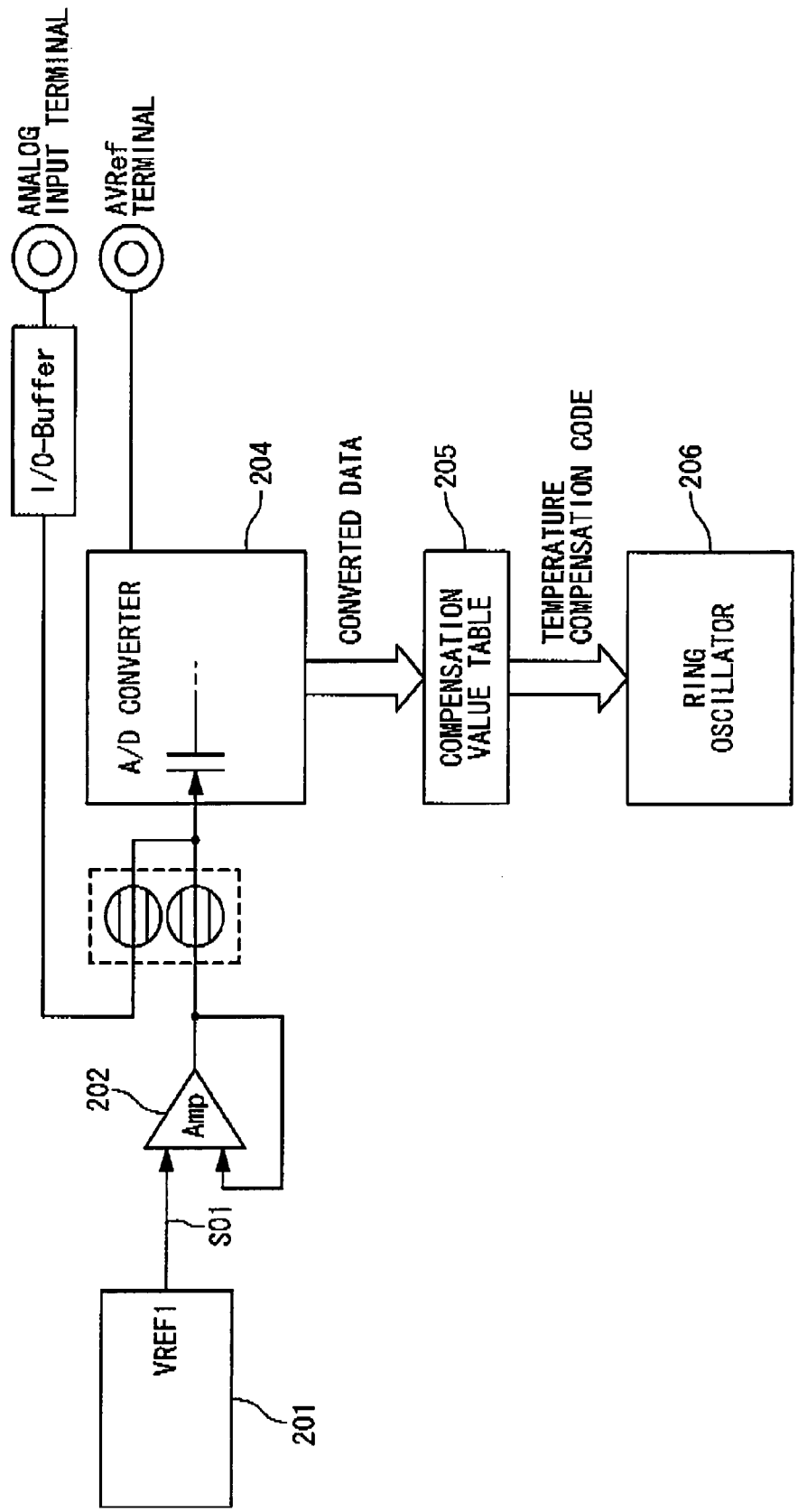
FIG. 11 is a block diagram of a comparison example exemplifying the configuration of the semiconductor integrated circuit for carrying out the frequency compensation without using a temperature independent signal S8.

An effect achieved by the present embodiment will be described below by comparing with a configuration example shown in FIG. 11. FIG. 11 is a block diagram showing the configuration of a semiconductor IC, in which the frequency compensation is executed without using the temperature independent signal S8. With reference to FIG. 11, the semiconductor IC contains: a signal output circuit 201 for outputting a temperature dependent signal; and an amplifier 202 for amplifying the output of the signal output circuit 201 and providing the amplified signal to an A/D converter 204. Here, the temperature dependent signal is the output voltage level of a usual temperature sensor and varies dependently on the temperature. The temperature dependency is, for example, 0.4 volt at −40° centigrade and 0.7 volt at 85' centigrade.

The signal output circuit 201 sends this temperature dependent signal to the amplifier 202 when compensating the temperature dependency. The amplifier 202 amplifies the temperature dependent signal to generate an amplification temperature dependent signal S01. The signal S01 is sent to the A/D converter 204. The A/D converter 204 converts the analog amplification temperature dependent signal 301 into a digital signal by using the voltage AVRef as a reference voltage. The A/D converter 204 provides the conversion result to a compensation value table 205. The compensation value table 205 sends the temperature compensation code corresponding to the conversion result to the ring oscillator and optimizes the output clock.

The A/D converter 204 operates similarly to the analog-digital converter 102 described in the previously mentioned Japanese Laid Open Patent Application JP-A-Heisei, 1-93904. Thus, the voltage level (the temperature dependent signal) having the temperature dependency is converted by using the voltage AVRef as a reference voltage. Even if a substrate manufacturer designs a circuit substrate for supplying 0 volt, there is a case that because of a loss, a voltage drop and the like, the actual reference voltage AVRef supplied to the A/D converter 204 consequently includes deviations. For example, when the reference voltage AVRef=4.95 v or 5.0 v, the digital signal outputted from the A/D converter 204 differs from the case when AVRef=5.0 v.

The band gap reference circuit 2 of the present embodiment outputs the temperature dependent signal S7 and the temperature independence signal S8, and the temperature compensation code is generated based on the first and second signal voltages S1, S2, which are generated by amplifying the signals 57, SB respectively. Specifically, the temperature dependent signal voltage and temperature independent signal voltage are A/D-converted, and the temperature compensation codes are generated in accordance with the ratios of the respective conversion results. Even if the reference voltage used in the A/D conversion has deviations, the ratio itself at a certain particular temperature is always constant. Thus, by executing the trimming using the temperature compensation code based on the ratio, it is possible to carry out the trimming at high precision.

It is apparent that the present invention is not limited to the above embodiments, but may be modified and changed without departing from the scope and spirit of the invention.

What is claimed is:

1. A semiconductor integrated circuit comprising:
a signal voltage output unit configured to output a first signal voltage having temperature dependency and a second signal voltage being constant independently on a temperature;
an A/D converter configured to convert an input signal voltage into a digital signal based on a reference signal; and
a compensation code generation unit configured to compensate a frequency of an oscillator in response to the digital signal outputted from the A/D converter,
wherein the A/D converter generates a first conversion signal by digitalizing a first difference voltage being a ratio between the first signal voltage and the reference voltage and a second conversion signal by digitalizing a second difference voltage being a ratio between the second signal voltage and the reference voltage, and
the compensation code generation unit generates the compensation code in response to the first conversion signal and the second conversion signal.

2. The semiconductor integrated circuit according to claim 1, wherein the compensation code generation unit includes:
- a comparator configured to receive the first conversion signal and the second conversion signal, and to output a comparison signal indicating a calculated ratio between the first conversion signal and the second conversion signal; and
- a compensation value table configured to hold a first defined comparison value indicating the calculated ratio at a first defined temperature and a second defined comparison value indicating the calculated ratio at a second defined temperature different to the first defined temperature, to receive the comparison signal, and to generate the compensation code in response to a temperature characteristic obtained from the first and second defined comparison values and the comparison signal.

3. The semiconductor integrated circuit according to claim 2, wherein the compensation value table holds a first compensation code corresponding to the first defined comparison value and a second compensation code corresponding to the second defined comparison value, and generates the compensation code at present condition indicated by TTRMnow by using a following equation:

$$TTRMnow=\{(TRH-TRL)/(TSH-TSL)\}*(TSnow-TSL)+TRL$$

wherein each variable is defined as follows:
- TSL: the first defined comparison value;
- TSH: the second defined comparison value;
- TSnow: a comparison value indicated by the comparison signal;
- TRL: the first compensation code; and
- TTRMnow: the second compensation code.

4. The semiconductor integrated circuit according to claim 3, wherein the signal voltage output unit includes:
- a band gap reference circuit having a temperature sensor and configured to output a temperature dependent signal corresponding to an output of the temperature sensor and a temperature independent signal set to be constant independently on the output of the temperature sensor;
- a first amplifier configured to generate the first signal voltage by amplifying the temperature dependent signal; and
- a second amplifier configured to generate the second signal voltage by amplifying the temperature independent signal.

5. The semiconductor integrated circuit according to claim 4, further comprising:
- a switch configured to connect the signal voltage output unit and the A/D converter in a frequency compensation mode, and to cut off the signal voltage output unit and the A/D converter in a normal mode.

6. A frequency compensation code generation method comprising:
- (a) generating a first signal voltage having a temperature dependency;
- (b) generating a second signal voltage set to be constant against a variation of temperature;
- (c) generating a first conversion signal by digitalizing a first difference signal being a ratio of the first signal voltage and a reference voltage;
- (d) generating a second conversion signal by digitalizing a second difference signal being a ratio of the second signal voltage and the reference voltage; and
- (e) generating a compensation code for compensating a clock frequency of a oscillator in response to a ratio of the first conversion signal and the second conversion signal.

7. The frequency compensation code generation method according to claim 6, wherein the (e) generating includes:
- receiving the first conversion signal and the second conversion signal to output a comparison signal indicating a ratio of the first conversion signal and the second conversion signal; and
- referencing a table storing a first defined comparison value indicating the ratio at a first defined temperature and a second defined comparison value indicating the ratio at a second defined temperature being different to the first defined temperature to generate the compensation code corresponding to the comparison signal and a temperature characteristic calculated from the first defined comparison value and the second defined comparison value.

8. The frequency compensation code generation method according to claim 7, wherein the (e) generating includes:
- reading out a first compensation code stored in the table correspondingly to the first defined comparison value and a second compensation code stored in the table correspondingly to the second comparison value from the table; and
- generating the compensation code at a present condition indicated by TTRMnow by using a following equation:

$$TTRMnow=\{(TRH-TRL)/(TSH-TSL)\}*(TSnow-TSL)+TRL$$

wherein each variable is defined as follows:
- TSL: the first defined comparison value;
- TSH: the second defined comparison value;
- TSnow: a comparison value indicated by the comparison signal;
- TRL: the first compensation code; and
- TTRMnow: the second compensation code.

9. A semiconductor integrated circuit comprising:
- an oscillator configured to supply a clock signal;
- a frequency compensation circuit having an A/D converter converting an input analog signal into an output digital signal, and configured to compensate a frequency of the clock signal in response to a reference voltage supplied to the A/D converter;
- an analog signal supply terminal configured to supply the analog signal; and
- a reference voltage supply terminal configured to supply the reference voltage, wherein the frequency compensation circuit includes:
- a signal voltage output unit configured to output a first signal voltage having temperature dependency and a second signal voltage being constant independently on a temperature;
- an A/D converter configured to convert an input signal voltage into a digital signal based on a reference signal; and
- a compensation code generation unit configured to compensate a frequency of an oscillator in response to the digital signal outputted from the A/D converter, and the A/D converter generates a first conversion signal by digitalizing a first difference voltage being a ratio between the first signal voltage and the reference voltage and a second conversion signal by digitalizing a second difference voltage being a ratio between the second signal voltage and the reference voltage, the compensation code generation unit generates the compensation code in response to the first conversion signal and the second conversion signal to supply the compensation code to the oscillator, and the oscillator compensates a frequency of the clock signal corresponding to the compensation code.

* * * * *